(12) United States Patent
Cho et al.

(10) Patent No.: US 11,916,562 B2
(45) Date of Patent: Feb. 27, 2024

(54) CURRENT STEERING DIGITAL-TO-ANALOG CONVERTER AND INTEGRATED CIRCUIT INCLUDING THE SAME

(71) Applicant: SAMSUNG ELECTRONICS CO., LTD., Suwon-si (KR)

(72) Inventors: Youngsea Cho, Seongnam-si (KR); Wan Kim, Hwaseong-si (KR); Jiseon Paek, Suwon-si (KR); Seunghyun Oh, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/673,127

(22) Filed: Feb. 16, 2022

(65) Prior Publication Data

US 2022/0368337 A1    Nov. 17, 2022

(30) Foreign Application Priority Data

May 13, 2021    (KR) ........................ 10-2021-0062159

(51) Int. Cl.
*H03M 1/38* (2006.01)
*H03M 1/06* (2006.01)
*H03M 1/66* (2006.01)

(52) U.S. Cl.
CPC ............ *H03M 1/0617* (2013.01); *H03M 1/38* (2013.01); *H03M 1/66* (2013.01)

(58) Field of Classification Search
CPC ......... H03M 1/38; H03M 1/0617; H03M 1/66
USPC .................................................. 341/118, 144
See application file for complete search history.

(56) References Cited

U.S. PATENT DOCUMENTS

| | | | |
|---|---|---|---|
| 5,793,671 A | * | 8/1998 | Selcuk .................. G11C 11/412 365/210.1 |
| 6,275,179 B1 | * | 8/2001 | Mori ..................... H03M 1/068 341/144 |
| 7,292,172 B2 | | 11/2007 | Matsumoto et al. |
| 7,629,910 B2 | | 12/2009 | Ramadoss et al. |
| 7,639,081 B2 | | 12/2009 | Arakali et al. |
| 7,834,791 B2 | | 11/2010 | Huang et al. |
| 8,441,382 B2 | | 5/2013 | Mahajan et al. |
| 9,300,318 B1 | * | 3/2016 | Medina Sanchez-Castro ............. H03M 1/0863 |

(Continued)

OTHER PUBLICATIONS

Debajit Basak, et al., "An On-Chip Static and Dynamic DAC Error Correction Technique for High Speed Multibit Delta-Sigma Modulators", 2018 IEEE.

(Continued)

*Primary Examiner* — Peguy Jean Pierre
(74) *Attorney, Agent, or Firm* — F. Chau & Associates, LLC

(57) ABSTRACT

A current steering digital-to-analog converter includes a plurality of current cells each including a current source circuit and a current switch circuit to selectively output a current in response to a first input signal corresponding to a digital signal; a dummy current cell including a dummy current source circuit and a dummy current switch circuit to output a current in response to a second input signal; and a current switch bias circuit coupled to the dummy current cell to track a first voltage of an internal node of the dummy current source circuit and configured to generate a first bias voltage applied to the current switch circuit.

20 Claims, 17 Drawing Sheets

(56) References Cited

U.S. PATENT DOCUMENTS

| | | |
|---|---|---|
| 9,319,061 B1 | 4/2016 | Azarmnia et al. |
| 9,350,372 B2 | 5/2016 | Chang et al. |
| 9,660,647 B2 | 5/2017 | Chern et al. |
| 10,469,097 B1 | 11/2019 | Bothra |
| 10,965,308 B1 * | 3/2021 | Gruber ............... H03M 1/0845 |
| 2002/0044076 A1 | 4/2002 | Yao et al. |
| 2008/0024340 A1 | 1/2008 | Matsumoto et al. |
| 2008/0117088 A1 | 5/2008 | Huang et al. |
| 2010/0176978 A1 * | 7/2010 | Joseph ............... H03M 1/0678 |
| | | 341/144 |
| 2018/0151219 A1 * | 5/2018 | Hsu ....................... G11C 7/227 |
| 2020/0067520 A1 * | 2/2020 | Han ....................... H03M 1/68 |

OTHER PUBLICATIONS

ESSR dated Oct. 6, 2022 in corresponding EP Patent Application No. 22173222.5.

\* cited by examiner

CURRENT STEERING DIGITAL-TO-ANALOG CONVERTER AND INTEGRATED CIRCUIT INCLUDING THE SAME

CROSS-REFERENCE TO RELATED APPLICATION

This U.S. non-provisional patent application is based claims priority under 35 U.S.C. § 119 to Korean Patent Application No. 10-2021-0062159, filed on May 13, 2021, in the Korean Intellectual Property Office, the disclosure of which is incorporated by reference in its entirety herein.

1. TECHNICAL FIELD

The inventive concept relates to digital-to-analog conversion, and more particularly, to a current steering digital-to-analog converter and an integrated circuit including the same.

2. DISCUSSION OF RELATED ART

A digital-to-analog converter (DAC) is a system that converts a digital signal into an analog signal. During signal processing, there is a need for digital-to-analog conversion with a high accuracy while operating in a wide dynamic range at high clock frequencies. For example, a complementary metal-oxide-semiconductor (MOS) current steering digital-to-analog converter structure may be used to implement the DAC.

The current steering digital-to-analog converter may be implemented by an n-channel MOS (nMOS) or a p-channel MOS (pMOS) transistor. A current steering digital-to-analog converter included in an integrated circuit may need to perform a smooth conversion operation at a low power supply voltage. However, as an internal voltage of the current steering digital-to-analog converter changes according to changes in process, voltage, and temperature (PVT), operation modes of transistors of the current steering digital-to-analog converter are changed, and thus, a conversion operation may not be performed properly.

SUMMARY

At least one embodiment of the inventive concept provides a current steering digital-to-analog converter and an integrated circuit including the same, in which a smooth conversion operation may be performed regardless of changes in PVT.

According to an embodiment of the disclosure, a current steering digital-to-analog converter includes a plurality of current cells each including a current source circuit and a current switch circuit to selectively output a current in response to a first input signal corresponding to a digital signal, a dummy current cell including a dummy current source circuit and a dummy current switch circuit to output a current in response to a second input signal, and a current switch bias circuit coupled to the dummy current cell to track a first voltage of an internal node of the dummy current source circuit and configured to generate a first bias voltage applied to the current switch circuit.

According to an exemplary embodiment of the disclosure, a current steering digital-to-analog converter includes a plurality of first current cells that each include a first current source circuit that generates a current according to first bias voltages, and a first current switch circuit that selectively outputs the current generated by the first current source circuit according to a second bias voltage and a first input signal, a first dummy current cell including a first dummy current source circuit that generates a current according to the first bias voltages, and a first dummy current switch circuit that outputs the current generated by the first dummy current source circuit according to a third bias voltage associated with the second bias voltage and a second input signal, and a first current switch bias circuit configured to generate the third bias voltage whose level is adjusted to match an amount of a level change according to changes in PVT of a first voltage of an internal node of the first dummy current source circuit.

According to an embodiment of the disclosure, an integrated circuit includes a processor configured to output a digital signal, and a digital-to-analog converter configured to convert the digital signal to an analog signal, wherein the digital-to-analog converter includes a plurality of current cells configured to convert the digital signal into the analog signal based on current steering, a dummy current cell having a same structure as any one of the plurality of current cells, and a current switch bias circuit configured to track a first voltage of an internal node of the dummy current cell and to generate a first bias voltage applied to an output stage of the plurality of current cells.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the inventive concept will be described in detail with reference to the accompanying drawings.

Figure 1:
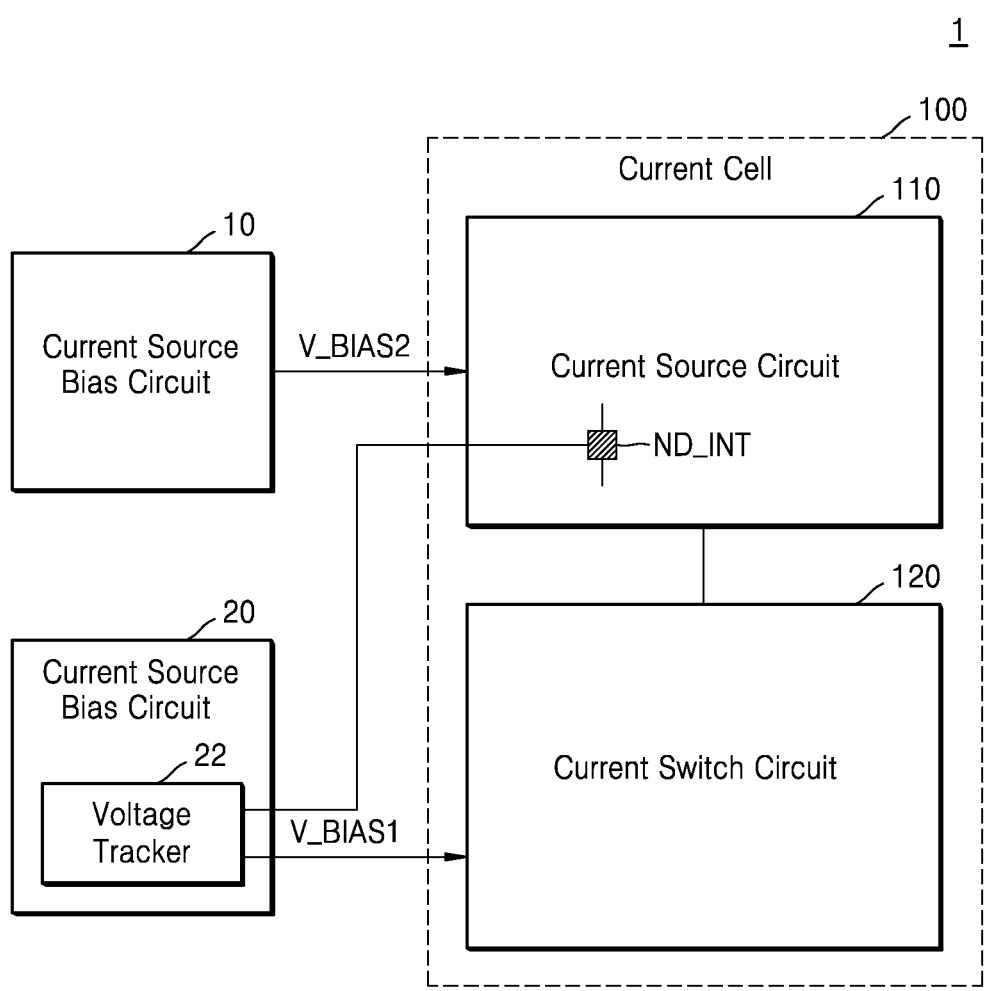
FIG. 1 is a block diagram schematically illustrating a current steering digital-to-analog converter according to an example embodiment of the inventive concept.

FIG. 1 is a block diagram schematically illustrating a current steering digital-to-analog converter 1 according to an example embodiment of the inventive concept.

Referring to FIG. 1, the current steering digital-to-analog converter 1 may include a current source bias circuit 10, a current switch bias circuit 20, and a current cell 100. The current cell 100 may include a current source circuit 110 and a current switch circuit 120. The current steering digital-to-analog converter 1 may include more current cells. The current cell 100 illustrated in FIG. 1 may be used to generate a first bias voltage V_BIAS1 and may be referred to as a dummy current cell. The dummy current cell may include a configuration same as a general current cell and may receive an input signal of a fixed value. The general current cell differs from the dummy current cell since it may receive an input signal of a variable value according to a digital signal. Details on this are described below with reference to FIG. 5.

The current source bias circuit 10 may generate a second bias voltage V_BIAS2 and provide the second bias voltage V_BIAS2 to the current source circuit 110. In an embodiment, the current source circuit 110 has a dual bias switched cascade structure, and in this case, there may be two second bias voltages V_BIAS2. The current source circuit 110 may generate a certain current in response to the second bias voltage V_BIAS2 and output the generated current. In an embodiment, the current source circuit 110 may function as a current mirror to copy a current flowing through the current source bias circuit 10 and output a current of which the magnitude is determined according to characteristics of transistors of the current source circuit 110.

In an example embodiment, the current switch bias circuit 20 may include a voltage tracker 22 (e.g., a circuit). The voltage tracker 22 may be coupled to an internal node ND_INT of the current source circuit 110 to detect a change in a first voltage of the internal node ND_INT and generate the first bias voltage V_BIAS1 for tracking the first voltage.

The first voltage of the internal node ND_INT may be changed according to changes in process, voltage, and temperature (PVT). In an example embodiment, the voltage tracker 22 may adjust a level of the first bias voltage V_BIAS1 such that a difference between the first voltage and the first bias voltage V_BIAS1 is constant even when the PVT is changed.

In an example embodiment, the current switch circuit 120 may output a current generated by the current source circuit 110 based on the first bias voltage V_BIAS1. Transistors (not illustrated) of an output stage of the current switch circuit 120 may stably operate in a saturation mode according to the first bias voltage V_BIAS1 tracking the first voltage internal node ND_INT regardless of changes in PVT. Details on this are described below with reference to FIG. 5 and so on.

In an example embodiment, the current switch bias circuit 20 may be activated or deactivated according to PVT conditions. For example, when it is difficult for transistors (not illustrated) of an output stage of the current switch circuit 120 to continuously operate in a saturation mode under first PVT conditions, the current switch bias circuit 20 may be activated, and when the transistors (not illustrated) of the output stage of the current switch circuit 120 continuously operate in the saturation mode under second PVT conditions different from the first PVT conditions, the current switch bias circuit 20 may be deactivated. In an example embodiment, when the current switch bias circuit 20 is deactivated, the current source bias circuit 10 may generate a fixed bias voltage on behalf of the current switch bias circuit 20 and provide the fixed bias voltage to the current switch circuit 120.

The current switch bias circuit 20 may provide the first bias voltage V_BIAS1 according to an example embodiment of the inventive concept to a plurality of current cells (not illustrated). Hereinafter, a current cell used to generate the first bias voltage V_BIAS1 is referred to as a dummy current cell. In addition, although embodiments of the inventive concept are described below with a focus on a change in temperature among changes in PVT, it will be fully understood that the embodiments of the inventive concept are not limited thereto.

The current steering digital-to-analog converter 1 according to an example embodiment of the inventive concept may generate the first bias voltage V_BIAS1 for tracking the first voltage of the internal node ND_INT of the current source circuit 110 which changes according to the change in PVT with a constant difference, and provide the first bias voltage V_BIAS1 to the output stage of the current switch circuit 120. Thus, transistors included in the output stage may stably operate in a saturation mode regardless of the change in PVT. As a result, there is an effect that the current steering digital-to-analog converter 1 may perform a stable conversion operation even when there are changes in PVT.

Figure 2:
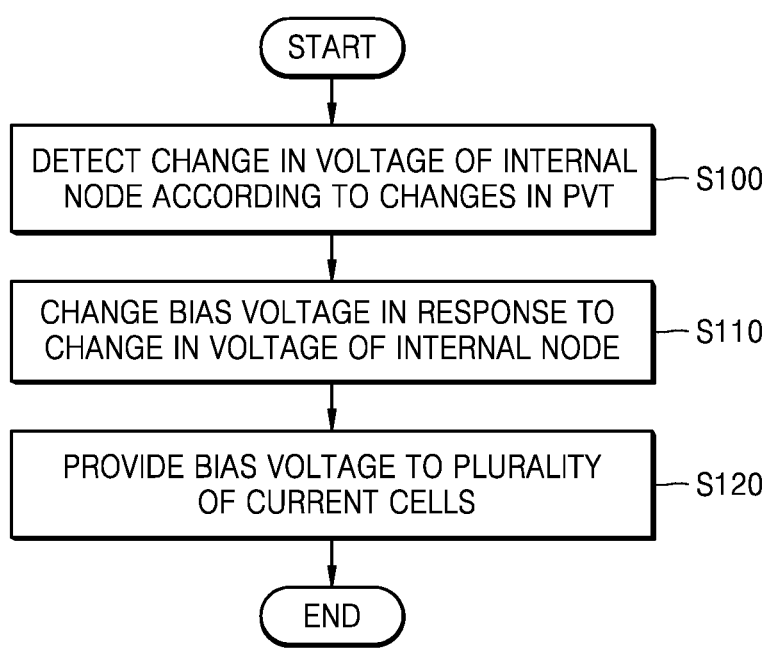
FIG. 2 is a flowchart illustrating a method of operating a current steering digital-to-analog converter, according to an example embodiment of the inventive concept.

FIG. 2 is a flowchart illustrating a method of operating a current steering digital-to-analog converter, according to an example embodiment of the inventive concept.

Referring to FIG. 2, in step S100, the current steering digital-to-analog converter detects a change in voltage of an internal node of a dummy current source circuit of a dummy current cell according to changes in PVT. In step S110, the current steering digital-to-analog converter changes a bias voltage provided to a dummy current switch circuit of the dummy current cell in response to the change in voltage of the internal node. In an example embodiment, the bias voltage may track the voltage of the internal node with a constant level difference from the voltage of the internal node. In an embodiment, the constant level difference also includes an error within a threshold according to changes in PVT. In step S120, the current steering digital-to-analog converter provides a bias voltage of which the level is adjusted in step S100 and step S110 to a plurality of current cells. As a result, transistors of an output stage of a current switch circuit of the plurality of current cells may stably operate in a saturation mode according to the adjusted bias voltage even when there are changes in PVT.

Figure 3:
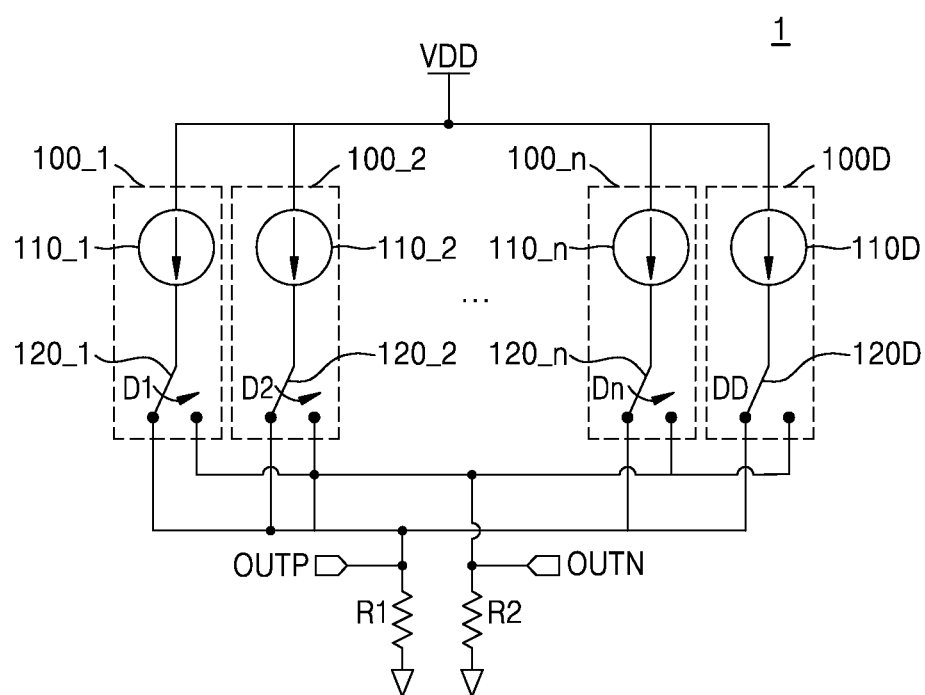
FIG. 3 is a diagram illustrating a current steering digital-to-analog converter according to an example embodiment of the inventive concept.

FIG. 3 is a diagram illustrating the current steering digital-to-analog converter 1 according to an example embodiment of the inventive concept.

Referring to FIG. 3, the current steering digital-to-analog converter 1 may include first to $n^{th}$ current cells 100_1 to 100_n, a dummy current cell 100D, and first and second resistors R1 and R2.

In an example embodiment, the first to $n^{th}$ current cells 100_1 to 100_n may respectively include current source circuits 110_1 to 110_n and current switch circuits 120_1 to 120_n. The current switch circuits 120_1 to 120_n may output, to a positive output terminal OUTP or a negative output terminal OUTN, currents generated by the current source circuits 110_1 to 110_n in response to input signals D1 to Dn corresponding to digital signals. One end of the first resistor R1 may be coupled to the positive output terminal OUTP, and the other end of the first resistor R1 may be grounded. One end of the second resistor R2 may be coupled to the negative output terminal OUTN, and the other end of the second resistor R2 may be grounded.

In an example embodiment, the dummy current cell 100D may be coupled between a power supply voltage VDD and the ground in parallel with the first to $n^{th}$ current cells 100_1 to 100_n. In addition, the dummy current cell 100D may be coupled to the first to $n^{th}$ current cells 100_1 to 100_n through the positive output terminal OUTP and the negative output terminal OUTN.

In an example embodiment, the dummy current cell 100D may include a dummy current source circuit 110D and a dummy current switch circuit 120D. The dummy current cell 100D may have a same structure as any one of the first to $n^{th}$ current cells 100_1 to 100_n. For example, when the dummy current cell 100D has a same structure as the first current cell 100_1, the dummy current source circuit 110D may have the same structure as the first current source circuit 110_1, and the dummy current switch circuit 120D may have the same structure as the first current switch circuit 120_1. Having the same structure may indicate that characteristics of transistors included in a circuit are the same as each other and coupling structures between the transistors are the same as each other. The dummy current switch circuit 120D may receive a dummy input signal DD. The dummy input signal DD may be a signal of a fixed value regardless of a digital signal, and in some embodiments, the dummy current switch circuit 120D may output a current generated by the dummy current source circuit 110D to the positive output terminal OUTP in response to the dummy input signal DD. The dummy input signal DD may be used to turn on/off the dummy current switch circuit 120D.

In an example embodiment, the dummy current cell 100D may be used to generate a bias voltage applied to output stages of the current switch circuits 120_1 to 120_n. In some embodiments, the current steering digital-to-analog converter 1 may further include a dummy current cell.

Figure 4:
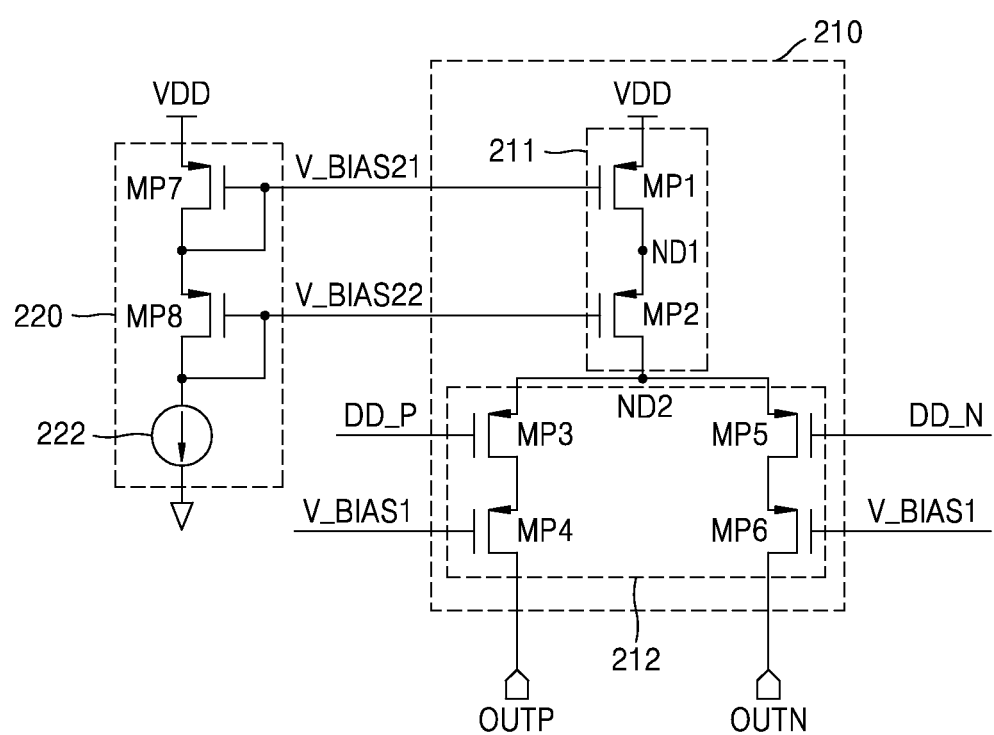
FIG. 4 is a circuit diagram illustrating a dummy current cell and a current source bias circuit according to an example embodiment of the inventive concept.

FIG. 4 is a circuit diagram illustrating a dummy current cell 210 and a current source bias circuit 220 according to an example embodiment of the inventive concept. The dummy current cell 210 may be used to implement the current cell 100 of FIG. 1 or the dummy current cell 100D of FIG. 3. The current source bias circuit 220 may be used to implement the current source bias circuits 10/20 of FIG. 1.

Referring to FIG. 4, the dummy current cell 210 may include a dummy current source circuit 211 and a dummy current switch circuit 212. The dummy current source circuit 211 may include a first pMOS transistor MP1 and a second pMOS transistor MP2. In an example embodiment, the first pMOS transistor MP1 and the second pMOS transistor MP2 may be coupled to each other in a cascade or in series. Specifically, a source of the first pMOS transistor MP1 may be coupled to a power supply voltage VDD, a gate thereof may receive a 2-1st bias voltage V_BIAS21, and a drain thereof may be coupled to a source of the second pMOS transistor MP2 through a first node ND1. A gate of the second pMOS transistor MP2 may receive a 2-2nd bias voltage V_BIAS22, and a drain thereof may be coupled to the dummy current switch circuit 212 through a second node ND2.

The dummy current switch circuit 212 may include a third pMOS transistor MP3, a fourth pMOS transistor MP4, a fifth pMOS transistor MP5, and a sixth pMOS transistor MP6. In an example embodiment, the third pMOS transistor MP3 and the fourth pMOS transistor MP4 may be coupled to each other in a cascade or in series, and the fifth pMOS transistor MP5 and the sixth pMOS transistor MP6 may be coupled to each other in cascade or in series. Specifically, a source of the third pMOS transistor MP3 may be coupled to a second node ND2, a gate thereof may receive a positive dummy input signal DD_P, and a drain thereof may be coupled to a source of the fourth pMOS transistor MP4. A gate of the fourth pMOS transistor MP4 may receive a first bias voltage V_BIAS1, and a drain thereof may be coupled to a positive output terminal OUTP. A source of the fifth pMOS transistor MP5 may be coupled to the second node ND2, a gate thereof may receive a negative dummy input signal DD_N, and a drain thereof may be coupled to a source of the sixth pMOS transistor MP6. In an embodiment, the negative dummy input signal DD_N is an inverted version of the positive dummy input signal DD_P. A gate of the sixth pMOS transistor MP6 may receive the first bias voltage V_BIAS1, and a drain thereof may be coupled to a negative output terminal OUTN. The third and fourth pMOS transistors MP3 and MP4 may operate complementary to the fifth and sixth pMOS transistors MP5 and MP6. In addition, the fourth and sixth pMOS transistors MP4 and MP6 that receive the first bias voltage V_BIAS1 and output a current generated by the dummy current source circuit 211 to the output terminals OUTP and OUTN in response to the first bias voltage V_BIAS1 may be defined as an output stage of the dummy current switch circuit 212.

In an example embodiment, the current source bias circuit 220 may include a current source 222 and seventh and eighth pMOS transistors MP7 and MP8. A source of the seventh pMOS transistor MP7 may be coupled to the power supply voltage VDD, and a gate and a drain thereof may be coupled to each other to generate the 2-1st bias voltage V_BIAS21. A source of the eighth pMOS transistor MP8 may be coupled to the drain of the seventh pMOS transistor MP7, and a gate and a drain thereof may be coupled to each other to generate a 2-2nd bias voltage V_BIAS22. The current source 222 may be coupled between the drain of the eighth pMOS transistor MP8 and the ground. The current source bias circuit 220 and the dummy current source circuit 211 may operate as a current mirror circuit, and the dummy current source circuit 211 may generate a preset amount of current through the first and second pMOS transistors MP1 and MP2. In an embodiment, the current source 222 outputs a constant current regardless of changes in PVT.

Figure 5A:
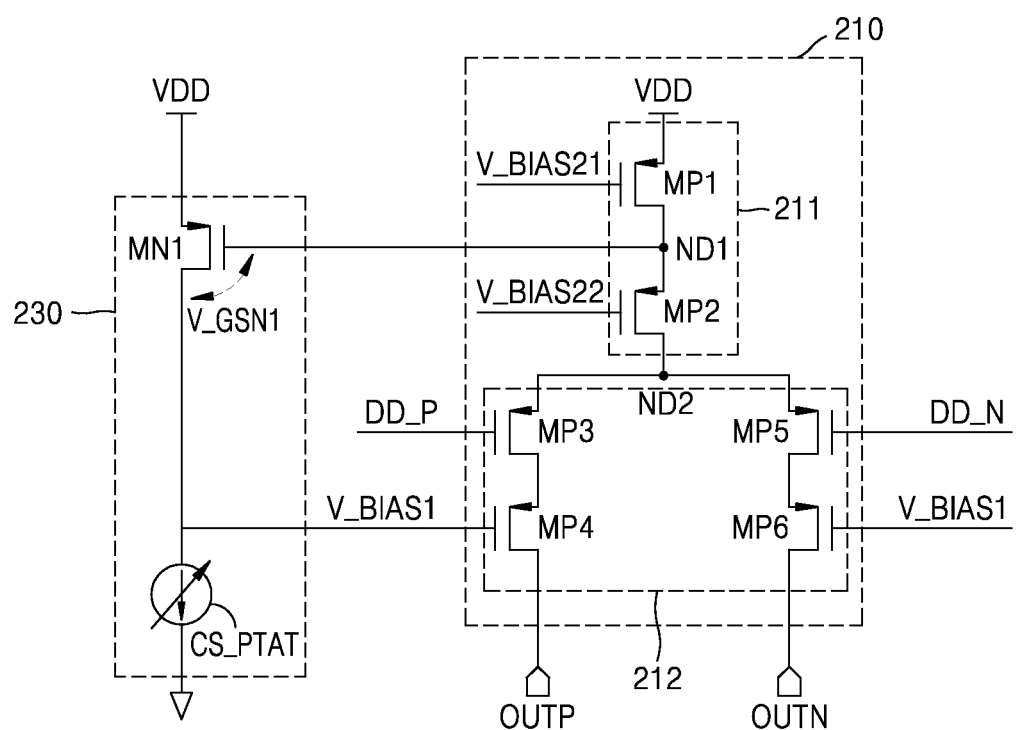
FIG. 5A is a circuit diagram illustrating a current switch bias circuit according to an example embodiment of the inventive concept.
Figure 5B:
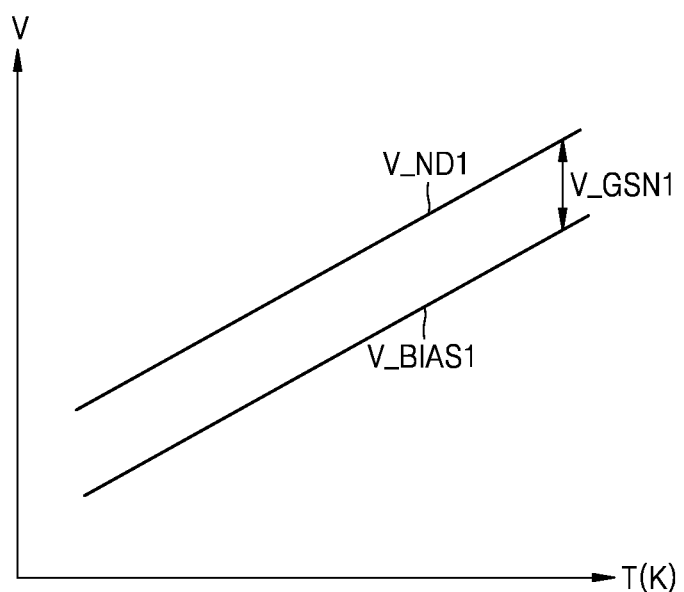
FIG. 5B is a graph illustrating a relationship between a first bias voltage and a first voltage of a first node.

FIG. 5A is a circuit diagram illustrating a current switch bias circuit 230 according to an example embodiment of the inventive concept, and FIG. 5B is a graph illustrating a relationship between the first bias voltage V_BIAS1 and a first voltage V_ND1 of a first node. Hereinafter, a structure of the dummy current cell 210 is specifically described with reference to FIG. 4, and thus, a detailed description thereof is omitted. The current source bias circuit 230 may be used to implement the current source bias circuits 10/20 of FIG. 1.

Referring to FIG. 5A, the current switch bias circuit 230 may include a first nMOS transistor MN1 and a proportional to absolute temperature (PTAT) current source CS_PTAT. A drain of the first nMOS transistor MN1 may be coupled to a power supply voltage VDD, a gate thereof may be coupled to a first node ND1 of the dummy current source circuit 211, and a source thereof may be coupled to the gate of the fourth pMOS transistor MP4 of the dummy current switch circuit 212 and one end of the PTAT current source CS_PTAT.

In an example embodiment, the current switch bias circuit 230 may generate the first bias voltage V_BIAS1 for tracking a first voltage V_ND1 of the first node ND1 as a source follower. In this case, the first node ND1 may correspond to the internal node ND_INT of FIG. 1. Specifically, the gate of the first nMOS transistor MN1 may receive the first voltage V_ND1 of the first node ND1 and receive the first bias voltage V_BIAS1 that is less than the first voltage V_ND1 by a first gate-source voltage V_GSN1.

In addition, a drain-source current of the first nMOS transistor MN1 operating in a saturation mode may be defined by Equation 1 below. Hereinafter, it is assumed that, for a normal digital-to-analog conversion operation, the first, second, fourth, and sixth pMOS transistors MP1, MP2, MP4, and MP6 operate in the saturation mode, and the third and fifth pMOS transistors MP3 and MP5 operate in a linear mode.

$$I_{DS} = \frac{1}{2} k_n \frac{W}{L} (V\_GSN1 - VTH)^2 \qquad \text{[Equation 1]}$$

As illustrated in Equation 1, the drain-source current $I_{DS}$ of the first nMOS transistor MN1 may be determined by a process constant $k_n$ of the first nMOS transistor MN1, a ratio between a width W and a length L of a channel of the first nMOS transistor MN1, and a difference between a first gate-source voltage V_GSN1 and a threshold voltage VTH of the first nMOS transistor MN1.

For example, when a temperature increases during an operation of the current steering digital-to-analog converter, a threshold voltage of the first pMOS transistor MP1 decreases, and thus, the first voltage V_ND1 of the first node ND1 may increase. When the first voltage increases, the current switch bias circuit 230 may generate an increasing first bias voltage V_BIAS1 by tracking the first voltage. A magnitude of the drain-source current $I_{DS}$ of the first nMOS transistor MN1 is increased by the PTAT current source CS_PTAT that outputs a larger current due to an increase in temperature, and accordingly, a first gate-source voltage V_GSN1 may be maintained constant even when the threshold voltage VTH of the first nMOS transistor MN1 increases. Accordingly, even when a temperature increases, the first bias voltage V_BIAS1 may completely track the first voltage V_ND1 of the first node ND1 according to the first gate-source voltage V_GSN1 with a constant magnitude.

Referring further to FIG. 5B, the first gate-source voltage V_GSN1 may be maintained constant by the PTAT current source CS_PTAT regardless of a change in a temperature T, and the first bias voltage V_BIAS1 may track the first voltage V_ND1 of the first node ND1 while maintaining a difference equal to the first gate-source voltage V_GSN1.

Referring back to FIG. 5A, a second voltage of a second node ND2 may be maintained constant through the first bias voltage V_BIAS1 for tracking the first voltage V_ND1. As a result, the fourth and sixth pMOS transistors MP4 and MP6 may stably operate in the saturation mode even when a temperature increases.

The above-described tracking method of the first voltage V_ND1 of the first node ND1 of the first bias voltage V_BIAS1 may be applied when a temperature decreases, when the power supply voltage VDD changes, or when a process changes.

The current switch bias circuit 230 according to the example embodiment of the inventive concept may generate the first bias voltage V_BIAS1 for maintaining a voltage of an internal node of each of a plurality of current cells corresponding to the second node ND2 of the dummy current source circuit 211 constant even when there are changes in PVT, thereby enabling transistors of an output stage of a current switch circuit of the plurality of current cells to continuously operate in a saturation mode.

Figure 6:
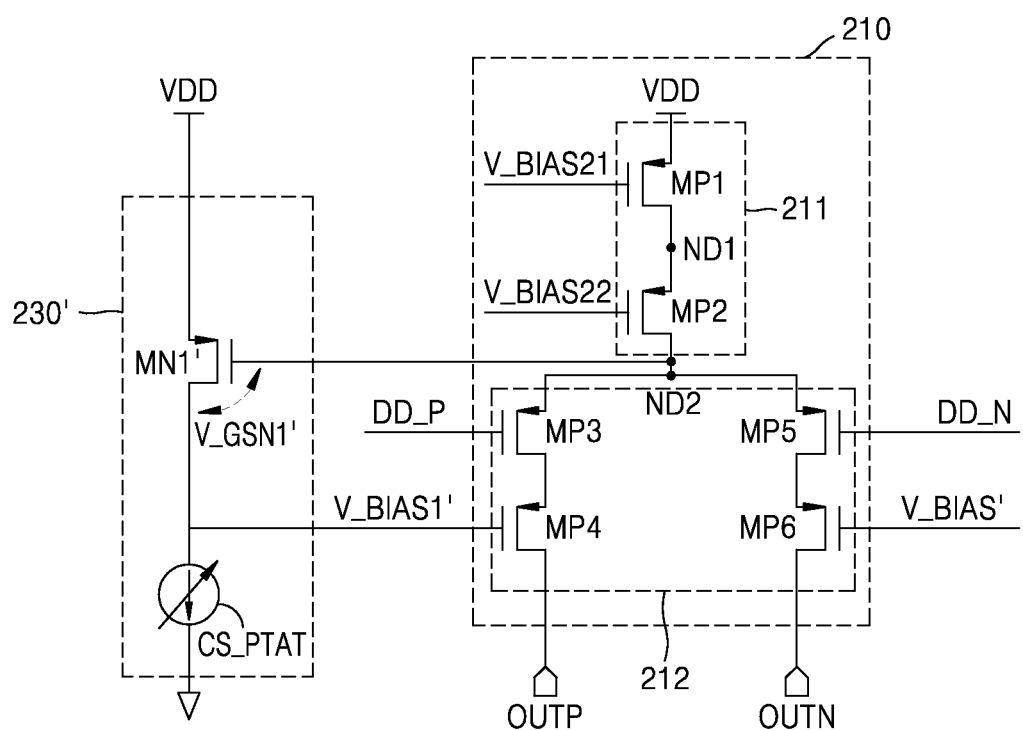
FIG. 6 is a circuit diagram illustrating a current switch bias circuit according to an example embodiment of the inventive concept.

FIG. 6 is a circuit diagram illustrating a current switch bias circuit 230' according to an example embodiment of the inventive concept. The current source bias circuit 230' may be used to implement the current source bias circuits 10/20 of FIG. 1. Hereinafter, a difference between the current switch bias circuit 230' and the current switch bias circuit 230 of FIG. 5 will be mainly described.

Referring to FIG. 6, the current switch bias circuit 230' may include a first nMOS transistor MN1' and a PTAT current source CS_PTAT. In an embodiment, the first nMOS transistor MN1' is a source follower or part of a source follower within 230'. A drain of the first nMOS transistor MN1' may be coupled to the power supply voltage VDD, a gate thereof may be coupled to the second node ND2 of the dummy current source circuit 211, and a source thereof may be coupled to a gate of the fourth pMOS transistor MP4 of the dummy current switch circuit 212 and one end of the PTAT current source CS_PTAT. In this case, the second node ND2 may correspond to the internal node ND_INT of FIG. 1. In an embodiment, the PTAT current source CS_PTAT is coupled to the source follower.

In an example embodiment, the current switch bias circuit 230' may generate a first bias voltage V_BIAS1' for tracking a second voltage of the second node ND2 and provide the first bias voltage V_BIAS1' to the fourth and sixth pMOS transistors MP4 and MP6. For example, the first bias voltage V_BIAS1' may be provided to gates of the fourth and sixth pMOS transistors MP4 and MP6.

In an example embodiment, the current switch bias circuit 230' allows the first bias voltage V_BIAS1' to completely track the second voltage of the second node ND2, based on a first gate-source voltage V_GSN1' that is constant even when there are changes in PVT, thereby ensuring a saturation mode operation of the fourth and sixth pMOS transistors MP4 and MP6.

Figure 7:
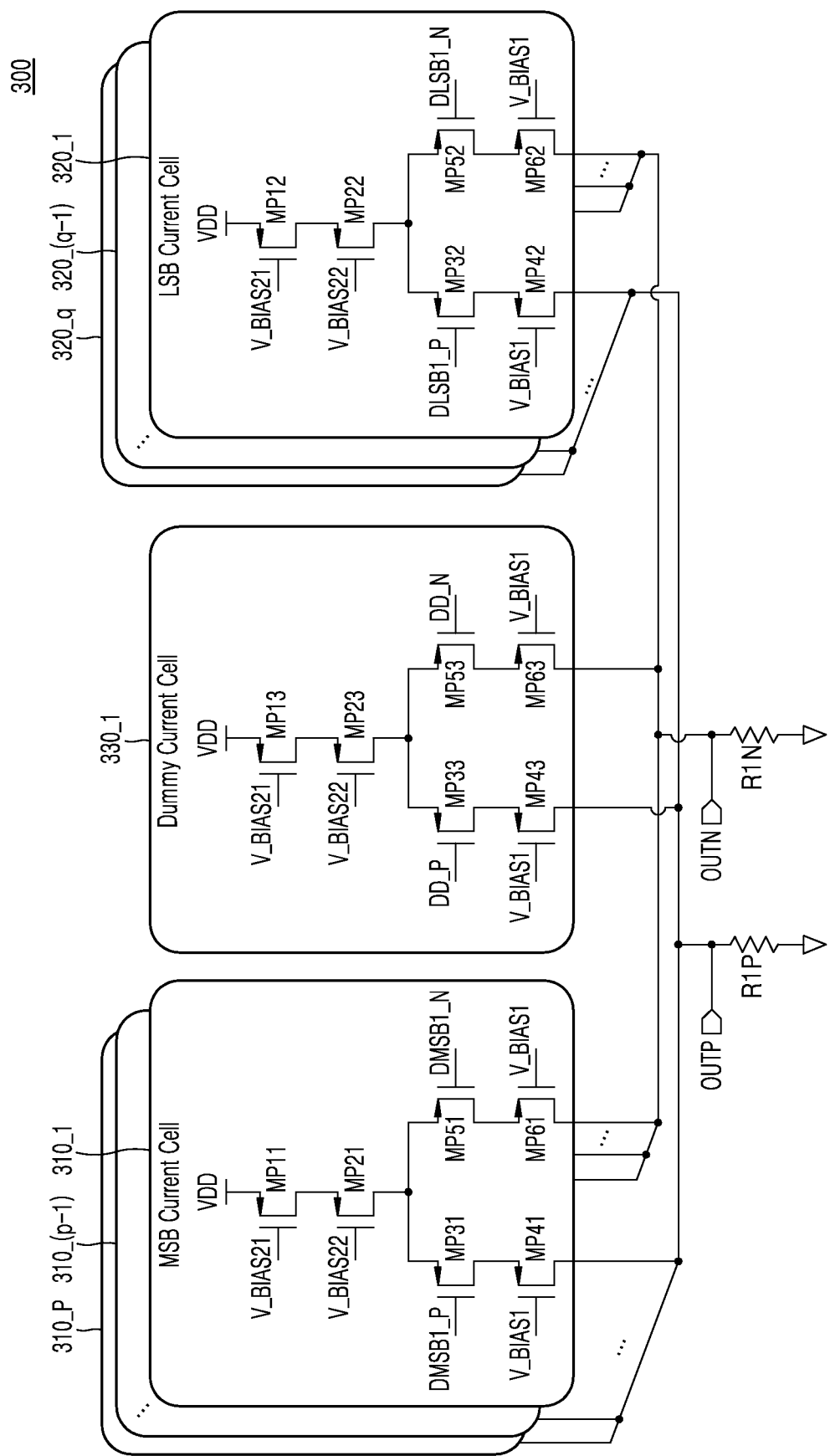
FIG. 7 is a circuit diagram illustrating a current steering digital-to-analog converter according to an example embodiment of the inventive concept.

FIG. 7 is a circuit diagram illustrating a current steering digital-to-analog converter 300 according to an example embodiment of the inventive concept.

Referring to FIG. 7, the current steering digital-to-analog converter 300 may include first to $p^{th}$ most significant bit (MSB) current cells 310_1 to 310_p, first to $q^{th}$ least significant bit (LSB) current cells 320_1 to 320_q, a dummy current cell 330_1, a first output resistor R1P, and a second output resistor R1N.

The first to $p^{th}$ MSB current cells 310_1 to 310_p may each receive an MSB input signal of one bit of an MSB portion of a digital signal and selectively output a current. The first to $q^{th}$ LSB current cells 320_1 to 320_q may each receive an LSB input signal of one bit of an LSB portion of a digital signal and selectively output a current.

In an example embodiment, the first to $p^{th}$ MSB current cells 310_1 to 310_$p$ may receive an input signal corresponding to a thermometer code and be controlled in a unary method, and the first to $q^{th}$ LSB current cells 320_1 to 320_$q$ may receive an input signal corresponding to a binary code and be controlled in a binary method. In an embodiment, a thermometer code is value representing the number N having the lowermost N bits as 1 and the other bits as 0.

The first MSB current cell 310_1 may include eleventh to 61st pMOS transistors MP11 to MP61. The eleventh and 21st pMOS transistors MP11 and MP21 may be coupled to each other in a cascade or in series, the 31st and 41st pMOS transistors MP31 and MP41 may be coupled to each other in a cascade or in series, and the 51st and 61st pMOS transistors MP51 and MP61 may be coupled to each other in a cascade or in series. The 31st and 41st pMOS transistors MP31 and MP41 may be coupled to the positive output terminal OUTP, and the 51st and 61st pMOS transistors MP51 and MP61 may be coupled to the negative output terminal OUTN. The first and second output resistors R1P and R1N may respectively convert currents flowing through the positive output terminal OUTP and the negative output terminal OUTN into voltages.

The eleventh pMOS transistor MP11 may receive a 2-1st bias voltage V_BIAS21 through a gate thereof, and the 21st pMOS transistor MP21 may receive a 2-2nd bias voltage V_BIAS22 through a gate thereof. The 31st pMOS transistor MP31 may receive a first positive MSB input signal DMSB1_P through a gate thereof, and the 51st pMOS transistor MP51 may receive a first negative MSB input signal DMSB1_N through a gate thereof. The 41st and 61st pMOS transistors MP41 and MP61 may respectively receive a first bias voltage V_BIAS1 according to example embodiments of the inventive concept through gates thereof. Accordingly, a saturation mode operation of the 41st and 61st pMOS transistors MP41 and MP61 constituting an output stage of the first MSB current cell 310_1 may be ensured even when there are changes in PVT.

A structure of the first MSB current cell 310_1 may also be applied to the second to $p^{th}$ MSB current cells 310_2 to 310_$p$.

The first LSB current cell 320_1 may include twelfth to 62nd pMOS transistors MP12 to MP62. The twelfth and 22nd pMOS transistors MP12 and MP22 may be coupled to each other in a cascade or in series, the 32nd and 42nd pMOS transistors MP32 and MP42 may be coupled to each other in a cascade or in series, and the 52nd and 62nd pMOS transistors MP52 and MP62 may be coupled to each other in a cascade or in series. The 32nd and 42nd pMOS transistors MP32 and MP42 may be coupled to the positive output terminal OUTP, and the 52nd and 62nd pMOS transistors MP52 and MP62 may be coupled to the negative output terminal OUTN.

The twelfth pMOS transistor MP12 may receive a 2-1st bias voltage V_BIAS21 through a gate thereof, and the 22nd pMOS transistor MP22 may receive a 2-2nd bias voltage V_BIAS22 through a gate thereof. The 32nd pMOS transistor MP32 may receive a first positive LSB input signal DLSB1_P through a gate thereof, and the 52nd pMOS transistor MP52 may receive a first negative LSB input signal DLSB1_N through a gate thereof. The 42nd and 62nd pMOS transistors MP42 and MP62 may respectively receive the first bias voltage V_BIAS1 according to the example embodiments of the inventive concept through gates thereof. Accordingly, a saturation mode operation of the 42nd and 62nd pMOS transistors MP42 and MP62 constituting an output stage of the first LSB current cell 320_1 may be ensured even when there are changes in PVT.

A structure of the first LSB current cell 320_1 may also be applied to the second to $p^{th}$ MSB current cells 320_2 to 320_$q$.

The dummy current cell 330_1 may include thirteenth to 63rd pMOS transistors MP13 to MP63. In an example embodiment, the dummy current cell 330_1 may have a same structure (e.g., circuit) as any one of the first to $p^{th}$ MSB current cells 310_1 to 310_$p$. For example, when the dummy current cell 330_1 is a duplicate circuit of the first MSB current cell 310_1, processes, characteristics, coupling structures, and so on of the thirteenth to 63rd pMOS transistors MP13 to MP63 may be identical to or similar to processes, characteristics, coupling structures, and so on of the eleventh to 61st pMOS transistors MP11 to MP61. In some embodiments, the dummy current cell 330_1 may be a duplicate circuit of any one of the first to $q^{th}$ LSB current cells 320_1 to 320_$q$.

In the dummy current cell 330_1, the thirteenth and 23rd pMOS transistors MP13 and MP23 may be coupled to each other in a cascade or in series, the 33rd and 43rd pMOS transistors MP33 and MP43 may be coupled to each other in a cascade or in series, and the 53rd and 63rd pMOS transistors MP53 and MP63 may be coupled to each other in a cascade or in series. The 33rd and 43rd pMOS transistors MP33 and MP43 may be coupled to the positive output terminal OUTP, and the 53rd and 63rd pMOS transistors MP53 and MP63 may be coupled to the negative output terminal OUTN.

The thirteenth pMOS transistor MP13 may receive the 2-1st bias voltage V_BIAS21 through a gate thereof, and the 23rd pMOS transistor MP23 may receive the 2-2nd bias voltage V_BIAS22 through a gate thereof. The 33rd pMOS transistor MP33 may receive a first positive dummy input signal DD_P through a gate thereof, and the 53rd pMOS transistor MP53 may receive a first negative dummy input signal DD_N through a gate thereof. As described above, a current switch bias circuit (not illustrated) may adjust the first bias voltage V_BIAS1 by applying the first bias voltage V_BIAS1 to gates of the 42nd and 62nd pMOS transistors MP42 and MP62. In an example embodiment, adjustment of the first bias voltage V_BIAS1 may be performed together with digital-to-analog conversion. That is, the first bias voltage V_BIAS1 may be adjusted in real time according to changes in PVT, and digital-to-analog conversion may be performed based on the real-time adjusted first bias voltage V_BIAS1.

In an example embodiment, the current steering digital-to-analog converter 300 may include more dummy current cells, and a specific embodiment thereof will be described below with reference to FIGS. 9 and 10.

Figure 8:
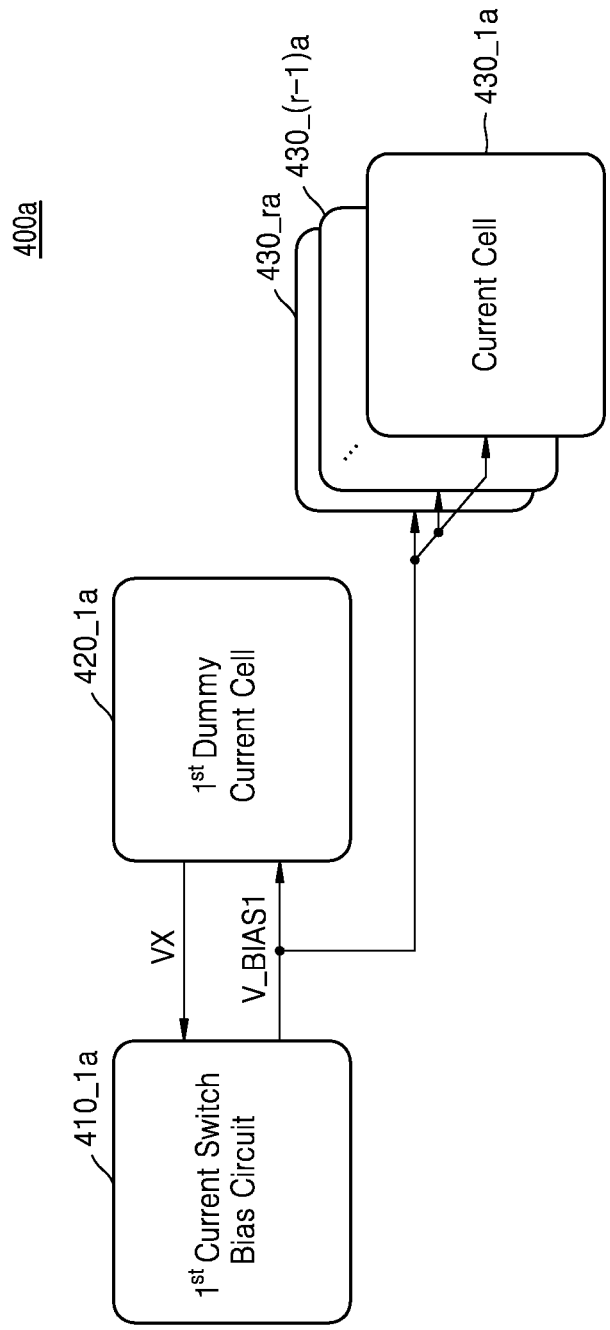
FIGS. 8 to 10 are block diagrams illustrating digital-to-analog converters according to example embodiments of the inventive concept.
Figure 9:
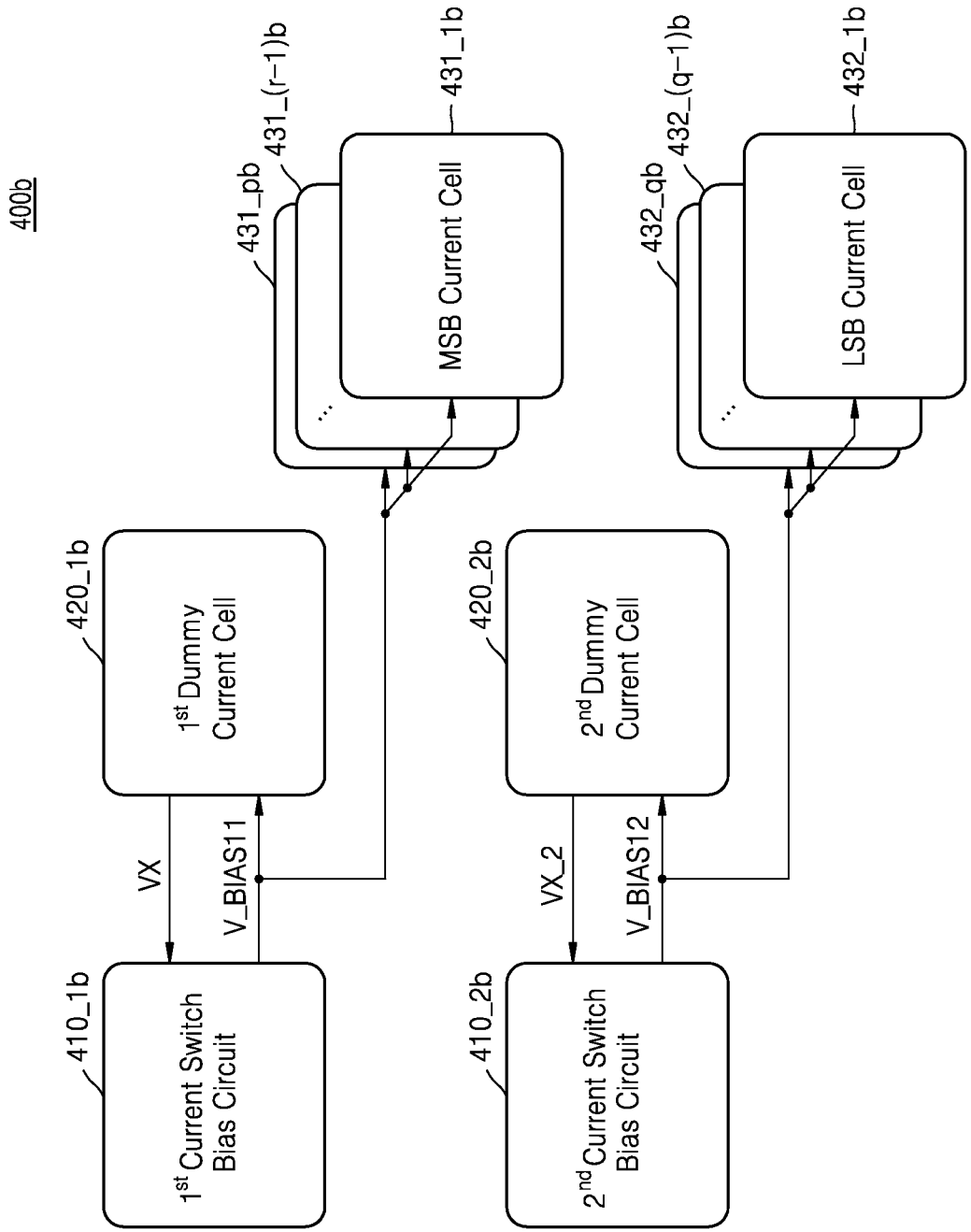
Figure 10:
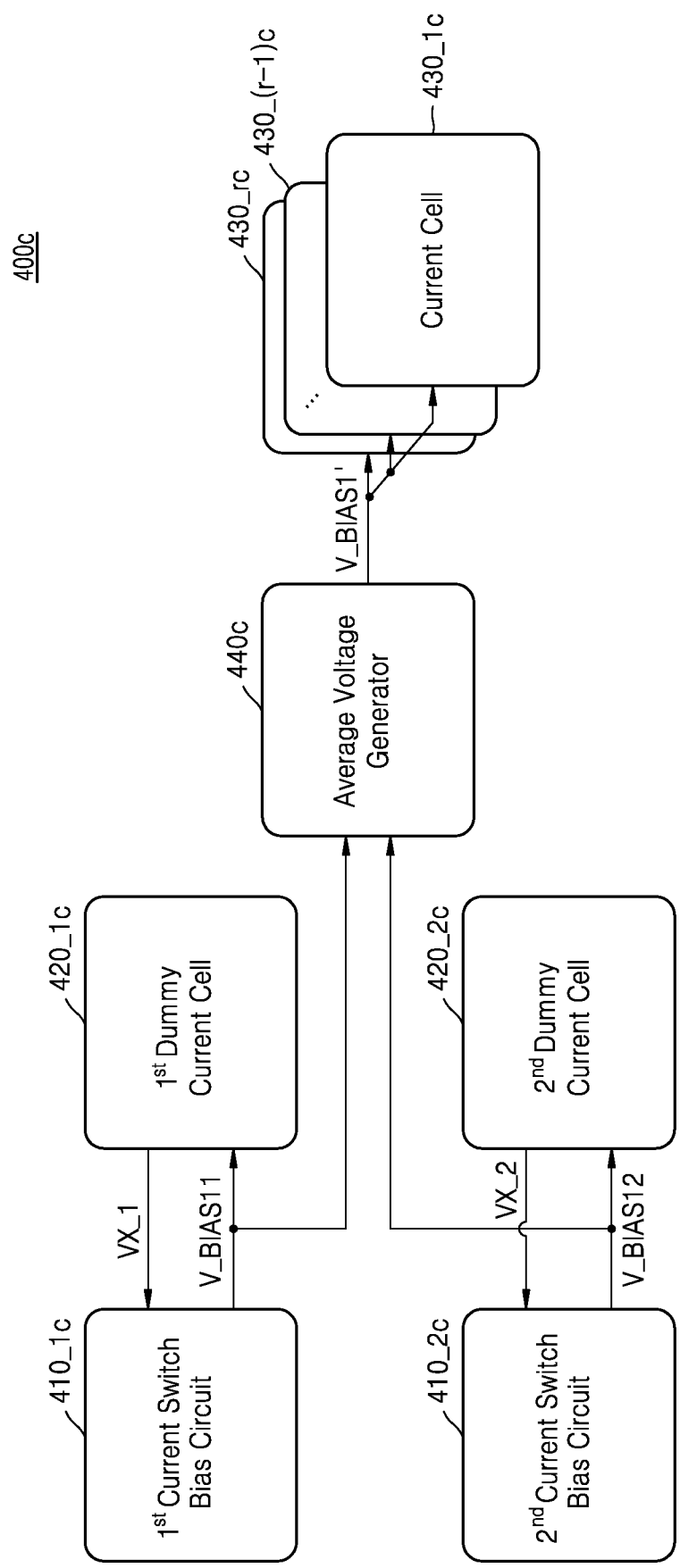

FIGS. 8 to 10 are block diagrams illustrating digital-to-analog converters 400$a$, 400$b$, and 400$c$ according to example embodiments of the inventive concept.

Referring to FIG. 8, the digital-to-analog converter 400$a$ may include a first current switch bias circuit 410_1$a$, a first dummy current cell 420_1$a$, and first to $r^{th}$ current cells 430_1$a$ to 430_$ra$.

In an example embodiment, the first current switch bias circuit 410_1$a$ may be coupled to an internal node of the first dummy current cell 420_1$a$ to receive a first voltage VX of the internal node and may generate a first bias voltage V_BIAS1 for tracking the first voltage VX. As described above, there may be a constant level difference between the first bias voltage V_BIAS1 and the first voltage VX even when there are changes in PVT. The first current switch bias circuit 410_1a may provide the generated first bias voltage V_BIAS1 to the first to $r^{th}$ current cells 430_1a to 430_ra.

Referring further to FIG. 9, the digital-to-analog converter 400b may include first and second current switch bias circuits 410_1b and 410_2b, first and second dummy current cells 420_1b and 420_2b, first to $p^{th}$ MSB current cells 431_1b to 431_pb, and first to $q^{th}$ LSB current cells 432_1b to 432_qb.

In an example embodiment, the first current switch bias circuit 410_1b may be coupled to an internal node of the first dummy current cell 420_1b to receive a first voltage VX_1 of the internal node and may generate a 1-1st bias voltage V_BIAS11 for tracking the first voltage VX_1. As described above, there may be a constant level difference between the 1-1st bias voltage V_BIAS11 and the first voltage VX_1 even when there are changes in PVT. The first current switch bias circuit 410_1b may provide the generated 1-1st bias voltage V_BIAS11 to the first to $p^{th}$ MSB current cells 431_1b to 431_pb. In an example embodiment, the first dummy current cell 420_1b may have a same structure as any one of the first to $p^{th}$ MSB current cells 431_1b to 431_pb to have the same circuit structure.

In an example embodiment, the second current switch bias circuit 410_2b may be coupled to the internal node of the second dummy current cell 420_2b to receive a second voltage VX_2 of the internal node and may generate a 1-2nd bias voltage V_BIAS12 for tracking the second voltage VX_2. As described above, there may be a constant level difference between the 1-2nd bias voltage V_BIAS12 and the second voltage VX_2 even when there are changes in PVT. The second current switch bias circuit 410_2b may provide the generated 1-2nd bias voltage V_BIAS12 to the first to $q^{th}$ LSB current cells 432_1b to 432_qb. In an example embodiment, the second dummy current cell 420_2b may have a same structure as any one of the first to $q^{th}$ LSB current cells 432_1b to 432_qb to have the same circuit structure.

Referring further to FIG. 10, the digital-to-analog converter 400c may include first and second current switch bias circuits 410_1c and 410_2c, first and second dummy current cells 420_1c and 420_2c, an average voltage generator 440c, and a plurality of current cells 430_1c to 430_rc. Hereinafter, a difference from FIG. 9 will be mainly described.

In an example embodiment, the average voltage generator 440c may calculate an average of the 1-1st and 1-2nd bias voltages V_BIAS11 and V_BIAS12 received from the first and second current switch bias circuits 410_1c and 410_2c to generate a first bias voltage V_BIAS1'. The average voltage generator 440c may provide the first bias voltage V_BIAS1' to the plurality of current cells 430_1c to 430_rc. In an example embodiment, the first and second dummy current cells 420_1c and 420_2c may have structures which are the same as each other or different from each other. In some embodiments, the digital-to-analog converter 400c may include more dummy current cells and current switch bias circuits, and the average voltage generator 440c may also generate the first bias voltage V_BIAS1' by calculating an average of the plurality of bias voltages received from the current switch bias circuits.

Figure 11:
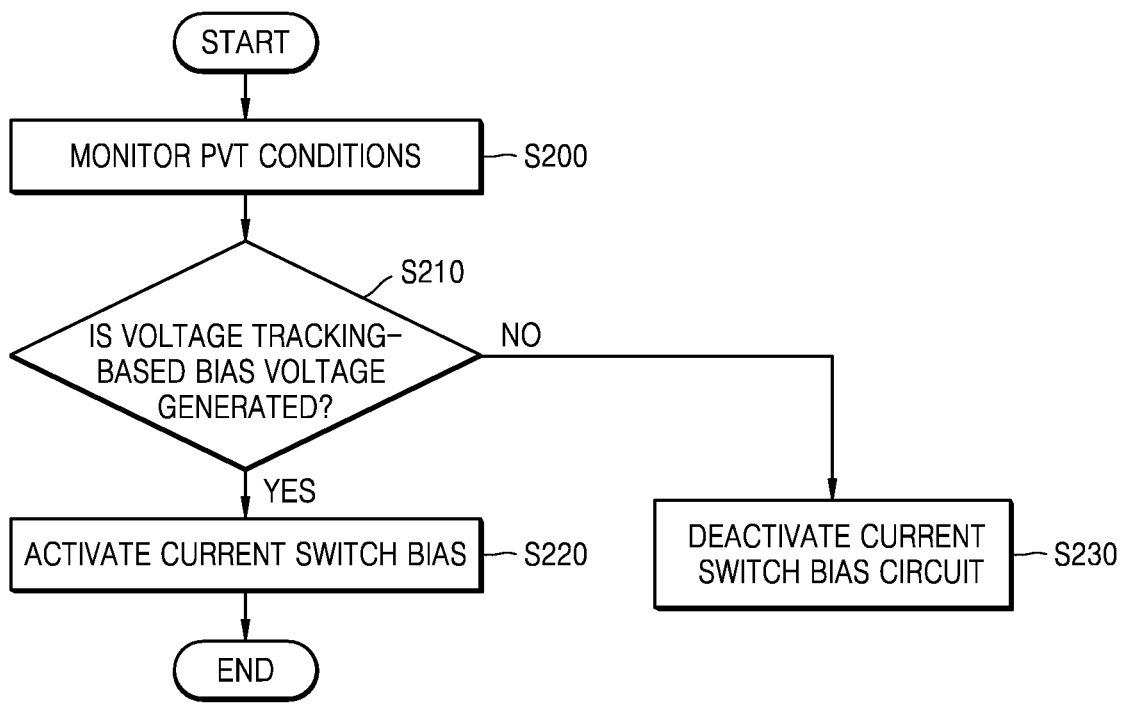
FIG. 11 is a flowchart illustrating a method of operating a current steering digital-to-analog converter, according to an example embodiment of the inventive concept.

FIG. 11 is a flowchart illustrating a method of operating a current steering digital-to-analog converter, according to an example embodiment of the inventive concept.

Referring to FIG. 11, in step S200, the current steering digital-to-analog converter monitors PVT conditions. In step S210, the current steering digital-to-analog converter determines whether or not to generate a voltage tracking-based bias voltage according to an example embodiment of the inventive concept, based on identified PVT conditions. When a continuous operation of a saturation mode of transistors of an output stage of current cells is predicted under the PVT conditions, a bias voltage generating method according to an example embodiment of the inventive concept may be deactivated to reduce power consumption.

When an answer of step S210 is "Yes", the current steering digital-to-analog converter activates a current switch bias circuit according to an example embodiment of the inventive concept, and then may adjust a level of a bias voltage according to changes in PVT in conjunction with a dummy current cell. When the answer of step S210 is "No", the current steering digital-to-analog converter deactivates the current switch bias circuit according to an example embodiment of the inventive concept.

Figure 12:
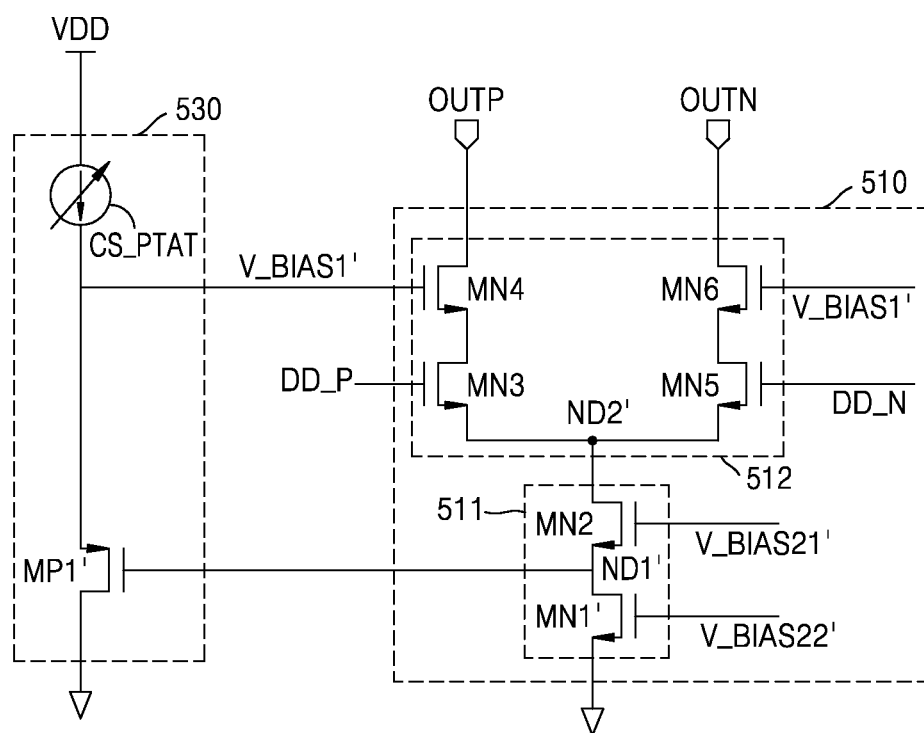
FIG. 12 is a circuit diagram illustrating a dummy current cell and a current switch bias circuit according to an example embodiment of the inventive concept.

FIG. 12 is a circuit diagram illustrating a dummy current cell 510 and a current switch bias circuit 530 according to an example embodiment of the inventive concept.

Referring to FIG. 12, the dummy current cell 510 may include a dummy current source circuit 511 and a dummy current switch circuit 512. The dummy current source circuit 511 may include a first nMOS transistor MN1' and a second nMOS transistor MN2. In an example embodiment, the first nMOS transistor MN1' and the second nMOS transistor MN2 may be coupled to each other in a cascade or in series. Specifically, a source of the first nMOS transistor MN1' may be grounded, a gate thereof may receive a 2-2nd bias voltage V_BIAS22', and a drain thereof may be coupled to a source of the second nMOS transistor MN2 through a first node ND1'. A gate of the second nMOS transistor MN2 may receive a 2-1st bias voltage V_BIAS21', and a drain thereof may be coupled to the dummy current switch circuit 512 through a second node ND2'.

The dummy current switch circuit 512 may include third to sixth nMOS transistors MN3 to MN6. In an example embodiment, the third nMOS transistor MN3 and the fourth nMOS transistor MN4 may be coupled to each other in a cascade or in series, and the fifth nMOS transistor MN5 and the sixth nMOS transistor MN6 may be coupled to each other in a cascade or in series. Specifically, a source of the third nMOS transistor MN3 may be coupled to the second node ND2', a gate thereof may receive a positive dummy input signal DD_P, and a drain thereof may be coupled to a source of the fourth nMOS transistor MN4. A gate of the fourth nMOS transistor MN4 may receive a first bias voltage V_BIAS1', and a drain thereof may be coupled to a positive output terminal OUTP. A source of the fifth nMOS transistor MN5 may be coupled to a second node ND2', a gate of the fifth nMOS transistor MN5 may receive a negative dummy input signal DD_N, and a drain thereof may be coupled to a source of the sixth nMOS transistor MN6. A gate of the sixth nMOS transistor MN6 may receive the first bias voltage V_BIAS1', and a drain thereof may be coupled to a negative output terminal OUTN. The third and fourth nMOS transistors MN3 and MN4 may operate complementary to the fifth and sixth nMOS transistors MN5 and MN6. In addition, the fourth and sixth nMOS transistors MN4 and MN6 that output a current generated by the dummy current source circuit 511 to the output terminals OUTP and OUTN in response to the first bias voltage V_BIAS1' may be defined as an output stage of the dummy current switch circuit 512.

In an example embodiment, current cells that perform a digital-to-analog conversion operation may include nMOS transistors like the dummy current cell 510.

In an example embodiment, the current switch bias circuit 530 may include a first pMOS transistor MP1' and a PTAT current source CS_PTAT. A drain of the first pMOS transistor MP1' may be grounded, a gate thereof may be coupled to the first node ND1' of the dummy current source circuit 511, and a source thereof may be coupled to a gate of the fourth nMOS transistor MN4 of the dummy current switch circuit 512 and one end of the PTAT current source CS_PTAT.

In an example embodiment, a current source bias circuit that generates the 2-1st and 2-2nd bias voltages V_BIAS21' and V_BIAS22' may include nMOS transistors.

In an example embodiment, the current switch bias circuit 530 may generate the first bias voltage V_BIAS1' by tracking a first voltage of the first node ND1', and since details thereof are described above a discussion of such is omitted here.

Figure 13:
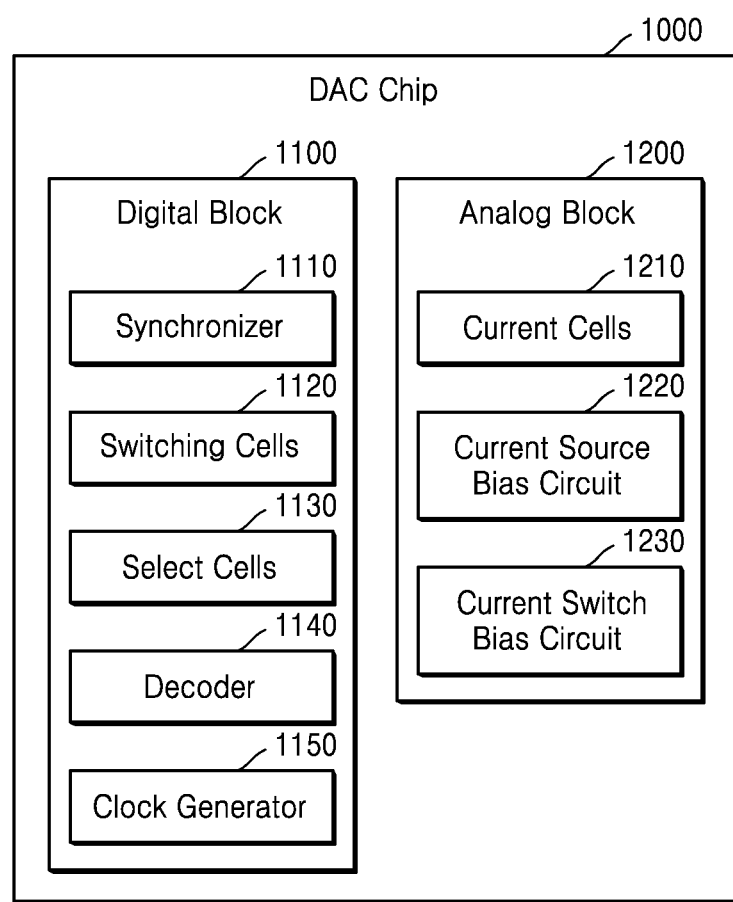
FIG. 13 is a block diagram schematically illustrating a digital-to-analog (DAC) chip according to an example embodiment of the inventive concept.

FIG. 13 is a block diagram schematically illustrating a digital-to-analog converter (DAC) chip 1000 according to an example embodiment of the inventive concept.

Referring to FIG. 13, the DAC chip 1000 may include a digital block 1100 (e.g., a first circuit) and an analog block 1200 (e.g., a second circuit). The digital block 1100 may perform a certain operation by being configured with software including code to be performed by a processor. In an example embodiment, the digital block 1100 may include a synchronizer 1110, a plurality of switching cells 1120, select cells 1130, a decoder 1140, and a clock generator 1150, which are used for a digital-to-analog conversion operation. In an example embodiment, the plurality of switching cells 1120 and the select cells 1130 may be implemented by a software logic for controlling selection and switching of current cells 1210 to be described below.

The analog block 1200 may consist of semiconductor devices as hardware. In an example embodiment, the analog block 1200 may include a plurality of current cells 1210, a current source bias circuit 1220, and a current switch bias circuit 1230 according to the above-described embodiments.

The plurality of current cells 1210 may include at least one dummy current cell (not illustrated) according to the above-described embodiments, and the current switch bias circuit 1230 may generate a bias voltage for ensuring a saturation mode operation of transistors of an output stage of the plurality of current cells 1210 by using at least one dummy current cell (not illustrated) even when there are changes in PVT.

Figure 14:
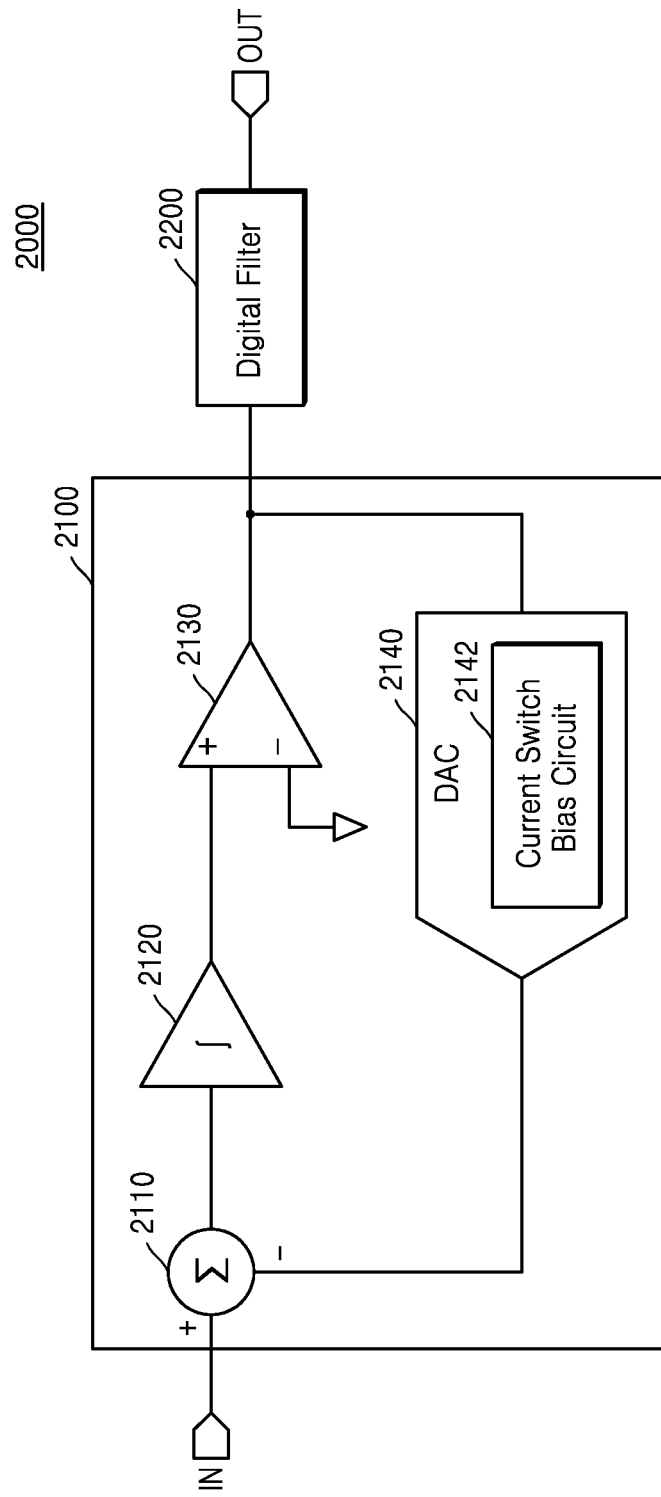
FIG. 14 is a block diagram schematically illustrating an integrated circuit according to an example embodiment of the inventive concept.

FIG. 14 is a block diagram schematically illustrating an integrated circuit 2000 according to an example embodiment of the inventive concept.

Referring to FIG. 14, the integrated circuit 2000 may include a delta-sigma converter 2100 and a digital filter 2200. The integrated circuit 2000 may generate a digital output signal OUT by performing a delta-sigma modulation of an analog input signal IN.

The delta-sigma converter 2100 may include a combiner 2110 (e.g., a summing circuit), an integrator 2120 (e.g., an integrator circuit), a comparator 2130 (e.g., a comparator circuit), and a digital-to-analog converter 2140. In an example embodiment, the combiner 2110 may combine the received analog input signal IN with a negative feedback signal output from the digital-to-analog converter 2140 and provide the combined signal to the integrator 2120. The integrator 2120 may integrate a received signal and provide the integrated signal to the comparator 2130. The comparator 2130 may compare a received signal with a preset reference signal and provide a compared result to the digital filter 2200, and the digital filter 2200 may output the digital output signal OUT as a bit stream.

In an example embodiment, the digital-to-analog converter 2140 may include a current switch bias circuit 2142 according to the above-described embodiments. The current switch bias circuit 2142 may generate a bias voltage to be provided to a plurality of current cells by using dummy current cells (not illustrated) of the digital-to-analog converter 2140.

Figure 15:
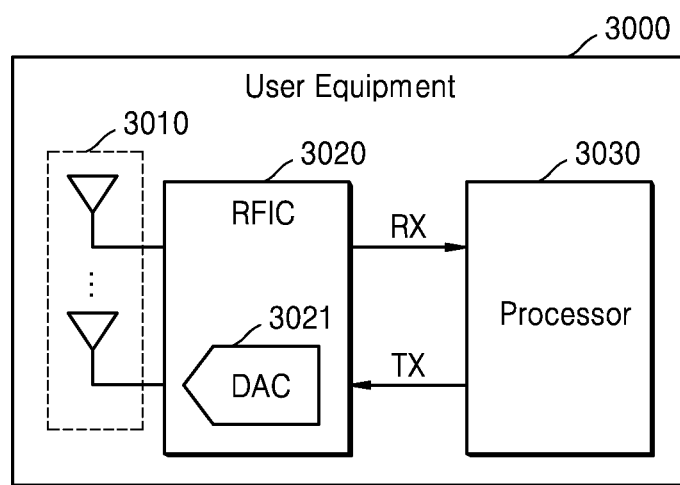
FIG. 15 is a block diagram illustrating user equipment according to an example embodiment of the inventive concept.

FIG. 15 is a block diagram illustrating user equipment 3000 according to an example embodiment of the inventive concept.

Referring to FIG. 15, the user equipment 3000 may include an antenna array 3010, a radio frequency integrated circuit (RFIC) 3020, and a processor 3030.

The antenna array 3010 may include at least one antenna and receive a radio frequency (RF) signal from a base station or another user equipment or transmit an RF signal thereto. In some embodiments, the antenna array 3010 may include a plurality of antennas for multi-input multi-output (MIMO).

The RFIC 3020 is hardware coupled to the antenna array 3010 and the processor 3030 and may provide an RF path for wireless communication. For example, the RFIC 3020 may be referred to as a transceiver and may also provide the processor 3030 with a reception signal RX as a baseband signal by processing an RF signal received from the antenna array 3010 and may also provide the antenna array 3010 with the RF signal by processing a transmission signal TX received from the processor 3030 as a baseband signal. The RFIC 3020 may be controlled by the processor 3030 and may include at least one of switches, matching circuits, filters, amplifiers, mixers, an analog-to-digital converter (ADC), a digital-to-analog converter (DAC) 3021, and so on, as non-limiting examples.

In addition, the above-described example embodiments of the inventive concept may be applied to the DAC 3021. Specifically, the DAC 3021 may serve as a current steering digital-to-analog converter and generate a bias voltage for enabling transistors to stably perform a saturation mode operation even when there are changes in PVT by using a dummy current cell and a current switch bias circuit according to an example embodiment of the inventive concept and provide the bias voltage to a plurality of current cells. The processor 3030 may communicate with the RFIC 3020 through the baseband signals RX and TX.

Figure 16:
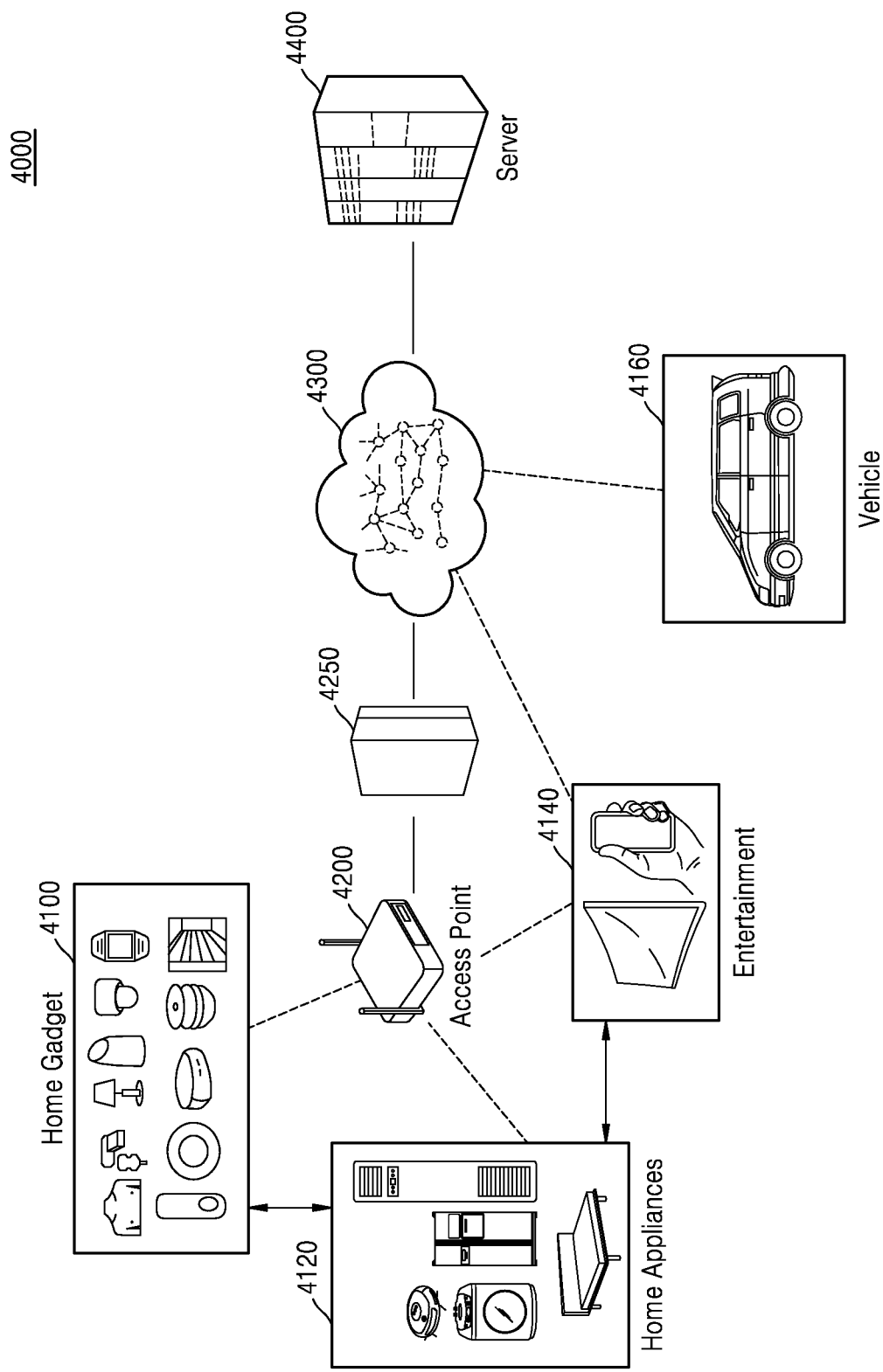
FIG. 16 is a conceptual diagram illustrating an Internet of things (IoT) network system to which embodiments of the inventive concept are applied.

FIG. 16 is a conceptual diagram illustrating an Internet of things (IoT) network system 4000 to which embodiments of the inventive concept may be applied.

Referring to FIG. 16, the IoT network system 4000 may include a plurality of IoT devices 4100, 4120, 4140, and 4160, an access point 4200, a gateway 4250, a wireless network 4300, and a server 4400. IoT may refer to a network between things that use wired/wireless communication.

The IoT devices 4100, 4120, 4140, and 4160 may form a group according to characteristics of respective IoT devices. For example, the IoT devices may be grouped into a home gadget group 4100, a home appliance/furniture group 4120, an entertainment group 4140, a vehicle group 4160, or so on. The plurality of IoT devices 4100, 4120, and 4140 may be coupled to a communication network or other IoT devices through the access point 4200. The access point 4200 may be embedded in one IoT device. The gateway 4250 may change a protocol to couple the access point 4200 to an external wireless network. The IoT devices 4100, 4120, and 4140 may be coupled to an external communication network through the gateway 4250. The wireless network 4300 may include the Internet and/or a public network. The plurality of IoT devices 4100, 4120, 4140, and 4160 may be coupled to the server 4400 that provides a certain service through the wireless network 4300, and a user may use a service through at least one of the plurality of IoT devices 4100, 4120, 4140, and 4160. The plurality of IoT devices 4100, 4120, 4140, and 4160 may include the current steering digital-to-analog converters according to the embodiments of the inventive concept.

While the inventive concept has been particularly shown and described with reference to embodiments thereof, it will be understood that various changes in form and details may be made therein without departing from the spirit and scope of the following claims.

What is claimed is:

1. A current steering digital-to-analog converter comprising:
   a plurality of current cells each including a current source circuit and a current switch circuit to selectively output a current in response to a first input signal corresponding to a digital signal;
   a dummy current cell including a dummy current source circuit and a dummy current switch circuit to output a current in response to a second input signal; and
   a current switch bias circuit coupled to the dummy current cell and configured to generate a first bias voltage that tracks a first voltage of an internal node of the dummy current source circuit and is applied to the current switch circuit,
   wherein the current switch bias circuit adjusts a level of the first bias voltage such that a difference between the first bias voltage and the first voltage is constant.

2. The current steering digital-to-analog converter of claim 1, wherein the difference is constant when there are changes in process, voltage, and temperature (PVT).

3. The current steering digital-to-analog converter of claim 1, wherein the current switch bias circuit comprises:
   a transistor coupled to the internal node through a gate of the transistor; and
   a proportional to absolute temperature (PTAT) current source coupled to a source of the transistor that outputs the first bias voltage.

4. The current steering digital-to-analog converter of claim 1, wherein the dummy current source circuit comprises a first transistor and a second transistor coupled to each other in a cascade structure, and wherein the first transistor is coupled to the second transistor through the internal node.

5. The current steering digital-to-analog converter of claim 1, wherein the dummy current source circuit is coupled to the current switch circuit through the internal node.

6. The current steering digital-to-analog converter of claim 1, further comprising:
   a current source bias circuit configured to generate a second bias voltage that is applied to the current source circuit of each of the plurality of current cells and the dummy current source circuit.

7. The current steering digital-to-analog converter of claim 1, wherein the dummy current switch circuit comprises:
   a first transistor and a second transistor coupled in parallel to each other and configured to respectively receive the second input signal and an inverted second input signal through gates of the first and the second transistor; and
   a third transistor and a fourth transistor respectively coupled to the first transistor and the second transistor in a cascade structure and configured to receive the first bias voltage through gates of the third transistor and the fourth transistor.

8. The current steering digital-to-analog converter of claim 1, wherein the dummy current cell has a same structure as any one of the plurality of current cells.

9. The current steering digital-to-analog converter of claim 8, wherein the dummy current cell has a same structure as a current cell corresponding to a most significant bit (MSB) of the digital signal among the plurality of current cells.

10. The current steering digital-to-analog converter of claim 1, wherein the current switch circuit of each of the plurality of current cells comprises:
    a first transistor and a second transistor coupled in parallel to each other and configured to respectively receive the first input signal and an inverted first input signal through gates of the first transistor and the second transistor; and
    a third transistor and a fourth transistor respectively coupled to the first transistor and the second transistor in a cascade structure and configured to receive the first bias voltage through gates of the third transistor and the fourth transistor.

11. The current steering digital-to-analog converter of claim 10, wherein the third transistor and the fourth transistor are configured to continuously operate in a saturation mode based on the first bias voltage adjusted according to changes in process, voltage, and temperature (PVT) regardless of whether there is a change in the PVT.

12. A current steering digital-to-analog converter comprising:
    a plurality of first current cells each including a first current source circuit that generates a current according to first bias voltages, and a first current switch circuit that selectively outputs the current generated by the first current source circuit according to a second bias voltage and a first input signal;
    a first dummy current cell including a first dummy current source circuit that generates a current according to the first bias voltages, and a first dummy current switch circuit that outputs the current generated by the first dummy current source circuit according to a third bias voltage associated with the second bias voltage and a second input signal; and
    a first current switch bias circuit configured to generate the third bias voltage having a level adjusted to match an amount of a level change according to changes in process, voltage, and temperature (PVT) of a first voltage of an internal node of the first dummy current source circuit.

13. The current steering digital-to-analog converter of claim 12, wherein the first current switch bias circuit comprises a transistor for generating the third bias voltage by tracking the first voltage, and a proportional to absolute temperature (PTAT) current source for maintaining a level difference between the first voltage and the third bias voltage regardless of the change in PVT.

14. The current steering digital-to-analog converter of claim 12, wherein the first dummy current source circuit comprises a first transistor and a second transistor coupled to each other in a cascade structure to receive the first bias voltages, and wherein the first transistor is coupled to the second transistor through the internal node.

15. The current steering digital-to-analog converter of claim 12, further comprising:
    a second dummy current cell including a second dummy current source circuit that generates a current according to the first bias voltages, and a second dummy current switch circuit that outputs the current generated by the second dummy current source circuit according to a fourth bias voltage associated with the second bias voltage and the second input signal; and a second current switch bias circuit configured to generate the fourth bias voltage having a level adjusted to match an amount of a level change according to changes in PVT of a second voltage of an internal node of the second dummy current source circuit.

16. The current steering digital-to-analog converter of claim 15, further comprising: a plurality of second current cells each including a second current source circuit that generates a current according to the first bias voltages, and a second current switch circuit that selectively outputs the current generated by the second current source circuit according to the fourth bias voltage and the first input signal, wherein the second bias voltage is equal to the third bias voltage.

17. The current steering digital-to-analog converter of claim 16, wherein the first dummy current cell has a same structure as any one of the plurality of first current cells, and wherein the second dummy current cell has a same structure as any one of the plurality of second current cells.

18. The current steering digital-to-analog converter of claim 15, wherein the second bias voltage is an average value of the third bias voltage and the fourth bias voltage.

19. An integrated circuit comprising:
a processor configured to output a digital signal; and
a digital-to-analog converter configured to convert the digital signal into an analog signal,
wherein the digital-to-analog converter comprises:
   a plurality of current cells configured to convert the digital signal into the analog signal based on current steering;
   a dummy current cell having a same structure as any one of the plurality of current cells; and
   a current switch bias circuit configured to generate a first bias voltage that tracks a first voltage of an internal node of the dummy current cell and is applied to an output stage of the plurality of current cells,
wherein the current switch bias circuit adjusts a level of the first bias voltage such that a difference between the first bias voltage and the first voltage is constant.

20. The integrated circuit of claim 19, wherein the current switch bias circuit comprises:
a source follower configured to receive the first voltage and to output the first bias voltage; and
a proportional to absolute temperature (PTAT) current source coupled to the source follower such that the difference is constant regardless of whether there are changes in process, voltage, and temperature (PVT).

* * * * *